(12) United States Patent
Cho et al.

(10) Patent No.: US 10,479,069 B2
(45) Date of Patent: Nov. 19, 2019

(54) METHOD FOR MANUFACTURING ANGLE AND CURVATURE DETECTION SENSOR, AND SENSOR

(71) Applicant: INDUSTRY-ACADEMY COOPERATION CORPS OF SUNCHON NATIONAL UNIVERSITY, Suncheon-si, Jeollanam-do (KR)

(72) Inventors: Gyou-jin Cho, Suncheon-si (KR); Jun Feng Sun, Suncheon-si (KR); Woo Kyu Lee, Jeollanam-do (KR); Jin Soo Noh, Suncheon-si (KR)

(73) Assignee: INDUSTRY-ACADEMY COOPERATION CORPS OF SUNCHON NATIONAL UNIVERSITY, Suncheon-si, Jeollanam-do (KR)

( * ) Notice: Subject to any disclaimer, the term of this patent is extended or adjusted under 35 U.S.C. 154(b) by 350 days.

(21) Appl. No.: 15/526,334

(22) PCT Filed: Nov. 26, 2014

(86) PCT No.: PCT/KR2014/011433
§ 371 (c)(1),
(2) Date: Sep. 29, 2017

(87) PCT Pub. No.: WO2016/076469
PCT Pub. Date: May 19, 2016

(65) Prior Publication Data
US 2018/0162117 A1   Jun. 14, 2018

(30) Foreign Application Priority Data
Nov. 13, 2014 (KR) .......................... 10-2014-0157848

(51) Int. Cl.
*B41F 13/187* (2006.01)
*G01B 7/293* (2006.01)
(Continued)

(52) U.S. Cl.
CPC ............ *B41F 13/187* (2013.01); *B41F 13/11* (2013.01); *G01B 7/293* (2013.01); *G01B 7/30* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 2009/0173935 A1* | 7/2009 | Cho | ....................... | B82Y 10/00 257/24 |
| 2014/0017041 A1* | 1/2014 | Jung | ....................... | H01L 22/10 414/222.01 |
| 2015/0253207 A1* | 9/2015 | Shigeto | .................... | G01B 7/24 73/862.625 |

FOREIGN PATENT DOCUMENTS

| | | |
|---|---|---|
| JP | 07-004963 A | 1/1995 |
| JP | 2012-181173 A | 9/2012 |

(Continued)

OTHER PUBLICATIONS

International Search Report for PCT/KR2014/011433 dated Aug. 6, 2015 from Korean Intellectual Property Office.

*Primary Examiner* — David H Banh
(74) *Attorney, Agent, or Firm* — Revolution IP, PLLC (57) ABSTRACT

The present invention relates to a method for manufacturing an angle and curvature detection sensor, and the sensor and, more specifically, to: a method for manufacturing a thin-film transistor array-based backplane by a roll-to-roll gravure printing process and manufacturing a sensor for measuring an angle change and a degree of curvature of the X axis and (Continued)

the Y axis by using the backplane; and the sensor. The method for manufacturing an angle and curvature detection sensor, according to an embodiment of the present invention, comprises the steps of: manufacturing a thin-film transistor backplane by a roll-to-roll gravure printing process; forming a protective layer on the thin-film transistor backplane by printing; forming a sealed space by adhering a flexible plastic case onto the upper part of the protective layer by means of an adhesive; and filling the sealed space with a first liquid and injecting a second liquid.

14 Claims, 11 Drawing Sheets

(51) Int. Cl.
*G01B 7/30* (2006.01)
*B41F 13/11* (2006.01)
*H01L 27/28* (2006.01)
*B82Y 30/00* (2011.01)
*B82Y 10/00* (2011.01)
*B82Y 15/00* (2011.01)

(52) U.S. Cl.
CPC ............ *H01L 27/283* (2013.01); *B82Y 10/00* (2013.01); *B82Y 15/00* (2013.01); *B82Y 30/00* (2013.01)

(56) References Cited

FOREIGN PATENT DOCUMENTS

| JP | 2012-207991 A | 10/2012 |
| KR | 10-2009-0113407 A | 11/2009 |
| KR | 10-2011-0057040 A | 5/2011 |

* cited by examiner

METHOD FOR MANUFACTURING ANGLE AND CURVATURE DETECTION SENSOR, AND SENSOR

TECHNICAL FIELD

The present invention relates to a method for manufacturing an angle and curvature detection sensor and the sensor, and more particularly, to a method for manufacturing a thin-film transistor array-based backplane by a roll-to-roll gravure printing process to manufacture a sensor for measuring an angle change and a degree of curvature of a X-axis and a Y-axis by using the backplane and the sensor.

BACKGROUND ART

As a material, printing, and process technology applied to printing electronics is developed, researches on manufacturing a printed thin-film transistor backplane capable of integrating a transistor element in an array type over an large area on a flexible board is being actively performed, and various applied devices such as a flexible display, an E-paper, an E-skin that is an expandable circuit, a wall-paper, and a flexible pressure sensor are being manufactured by using the backplane as a type of a sample for demonstration.

Also, due to development in technology of Internet of Things and microelectromechanical systems (MEMS), demands for sensors used in various fields such as a physical quantity detection sensor measuring an angular speed, an acceleration, and a position and a chemical sensor detecting a surrounding environment are remarkably increasing.

However, most of currently manufactured physical and chemical sensors are manufactured on a silicone wafer surface in a conventional semiconductor manufacturing process such as etching and deposition, which is difficult to be performed with low costs, large areas, and mass production, so that manufacturing costs are difficult to be reduced. Also, since a flexible property is hard to be applied thereto, the currently manufactured physical and chemical sensors are difficult to be applied to wearable and smart packages.

DISCLOSURE OF THE INVENTION

Technical Problem

The present invention provides a method for manufacturing an angle and curvature detection sensor, which is capable of performing low cost and mass production and achieving high productivity through a continuous process in such a manner that the thin-film transistor backplane is manufactured by printing using a roll-to-roll printing electronic technology instead of a thin-film transistor array-based backplane manufacturing process that is used in a conventional semiconductor manufacturing process, and then on the basis of the manufactured thin-film transistor backplane, the sensor capable of measuring the a 3-dimensional angle position and a degree of curvature is manufactured.

The present invention also provides a sensor capable of measuring a 3-dimensional angle position and a degree of curvature based on a printed thin-film transistor backplane manufactured by using a 100% roll-to-roll printing process and application thereof.

Technical Solution

An embodiment of the present invention provides a method for manufacturing an angle and curvature detection sensor including the following steps of: (a) manufacturing a thin-film transistor backplane by a roll-to-roll gravure printing process;

(b) forming a protective layer on the thin-film transistor backplane by printing;

(c) forming a sealed space by adhering a flexible case onto the protective layer by means of an adhesive; and (d) filling the sealed space with a first liquid and injecting a second liquid therein.

In an embodiment, the second liquid may be an ionic liquid drop having a small drop shape and moving on a surface of the protective layer to have an effect on an electrical characteristic of a thin-film transistor when staying on the protective layer right above the thin-film transistor and allow the electrical characteristic of the thin-film transistor to be restore when deviated therefrom, and the first liquid may be silicone oil providing buoyancy to the ionic liquid drop and having no effect on the electrical characteristic of the thin-film transistor.

In an embodiment, in the step (a), a conductive ink, a dielectric ink, an active layer ink, and an insulating ink may be printed by using a roll-to-roll gravure equipment to manufacture an N×M array thin-film transistor backplane.

In an embodiment, in the step (a), a printing speed may be 6 to 8 m/min.

In an embodiment, in the step (d), flow resistivity of the second liquid may be controlled by adjusting viscosity of the first liquid.

In an embodiment, the method may further include a step of forming a thin-film having a specific morphology and a thickness on the protective layer by printing between the step (b) and the step (c).

In an embodiment, in the step (b), Cytop may be printed to form the protective layer.

In an embodiment of the present invention, an angle and curvature detection sensor includes: a thin-film transistor backplane printed by using a roll-to-roll equipment and formed in an N×M array;

a protective layer for maintaining an electrical characteristic of the thin-film transistor backplane;

a second liquid having a small drop shape and moving on the protective layer to have an effect on an electrical characteristic of a thin-film transistor therebelow;

a first liquid providing buoyancy to allow the second liquid to move on the protective layer; and a flexible sealed case for holding the second liquid and the first liquid on a surface of the thin-film transistor backplane.

In an embodiment, the second liquid may be an ionic liquid drop, and the first liquid may be silicone oil.

In an embodiment, a thin-film having a specific morphology and a thickness may be formed on the protective layer by printing so that the ionic liquid drop has linear movement according to an angle position and a degree of curvature of the sensor.

In an embodiment, the specific morphology may be a shape of a mesh or a stair.

In an embodiment, the sensor may include four areas, and the ionic liquid drop may be provided on each of the four areas.

In an embodiment, the thin-film transistor may have a bottom gate structure including a gate layer, a dielectric layer, an active layer, an insulation layer, and a source/drain layer.

In an embodiment, a voltage applied to the drain and the gate may be fixed, and then a current flowing between the drain and the source may be measured to detect an angle and a degree of curvature of the sensor.

Advantageous Effects

According to the technical solution of the above-described technical problem, the thin-film transistor backplane is manufactured by printing using the roll-to-roll printing electronics technology instead of the thin-film transistor array-based backplane manufacturing process that is used in the conventional semiconductor manufacturing process, and then on the basis of the manufactured thin-film transistor backplane, the sensor capable of measuring the 3-dimensional angle position and the degree of curvature is manufactured. Thus, the low cost and mass production may be possible, and the high productivity may be achieved through the continuous process.

Also, as the gravure printing process is applied to the manufacturing of the flexible printing thin-film transistor backplane, the process at the low temperature and the atmospheric pressure is possible, the large area printing and the manufacturing method become simple, and the low cost production is possible.

MODE FOR CARRYING OUT THE INVENTION

Hereinafter, the constitution and operation of an embodiment of the present invention will be described with reference to the accompanying drawings.

Note that the same or similar components in the drawings are designated by the same reference numerals as far as possible even if they are shown in different drawings Hereinafter, detailed descriptions related to well-known functions or configurations will be ruled out in order not to unnecessarily obscure subject matters of the present invention.

Furthermore, when it is described that one comprises (or includes or has) some elements, it should be understood that it may comprise (or include or has) only those elements, or it may comprise (or include or have) other elements as well as those elements if there is no specific limitation.

Figure 1:
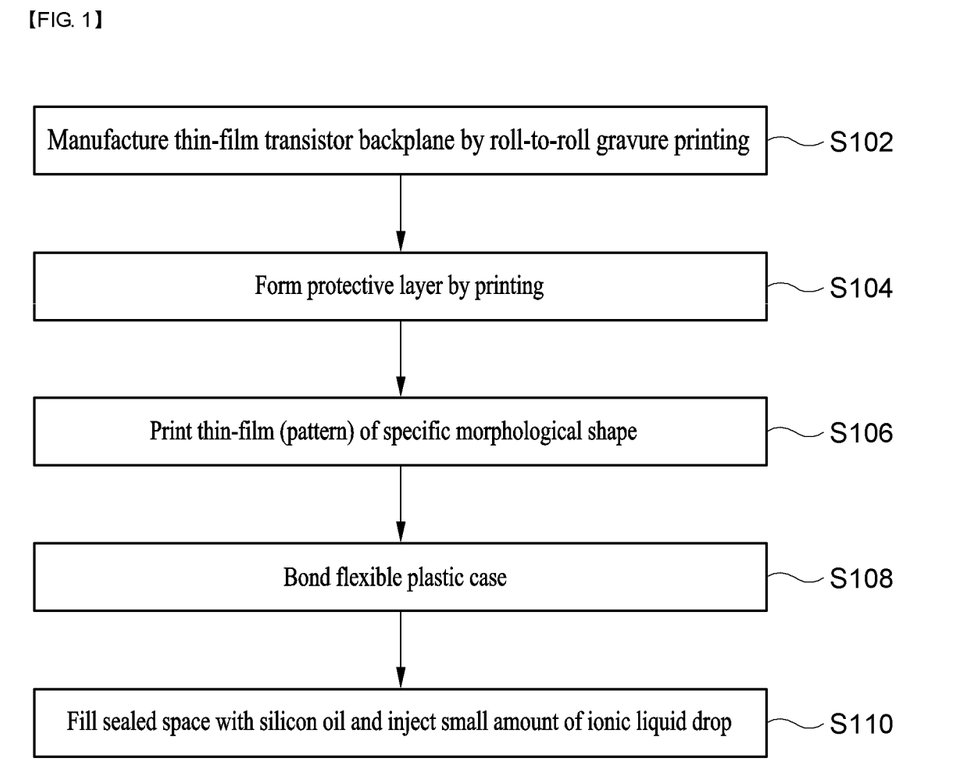
FIG. 1 is a manufacturing process chart of an angle and curvature detection sensor according to an embodiment of the present invention.

FIG. 1 is a manufacturing process chart of an angel and curvature detection sensor according to an embodiment of the present invention.

Figure 2:
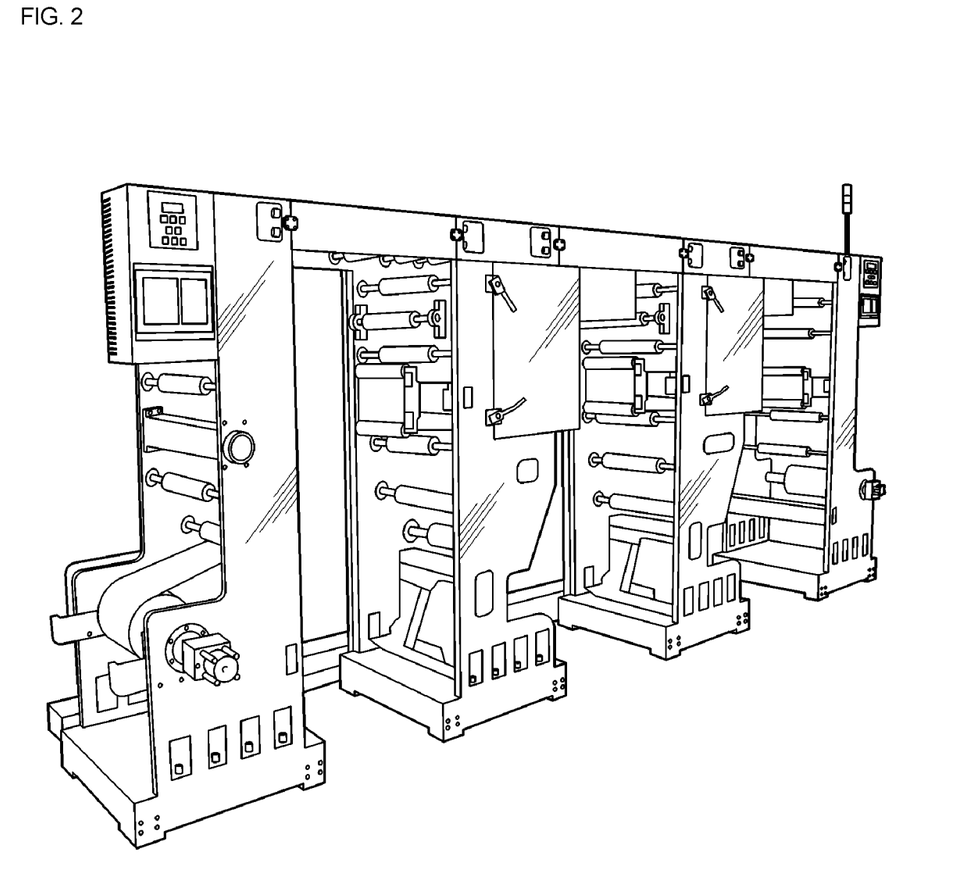
FIG. 2 is a photograph of roll-to-roll gravure equipment used for manufacturing a printed thin-film transistor backplane according to the present invention.
Figure 3:
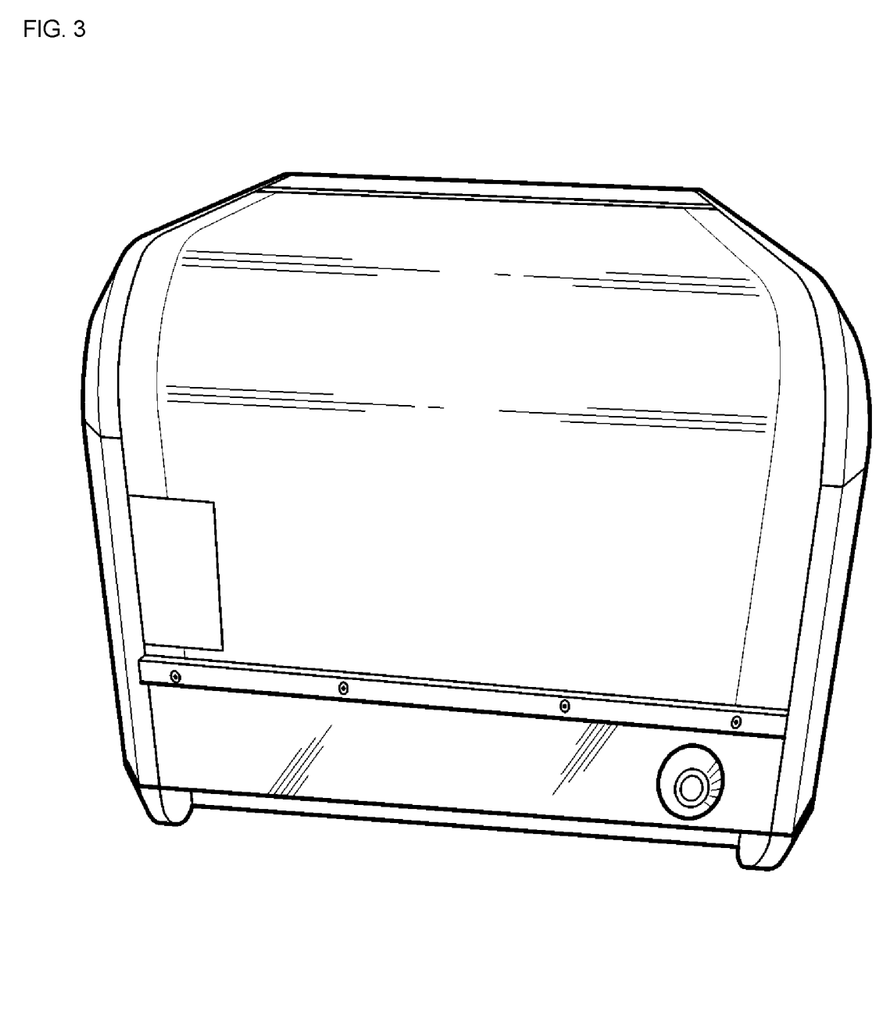
FIG. 3 is a photograph of an inkjet printer used for manufacturing the printed thin-film transistor backplane according to the present invention
Figure 4:
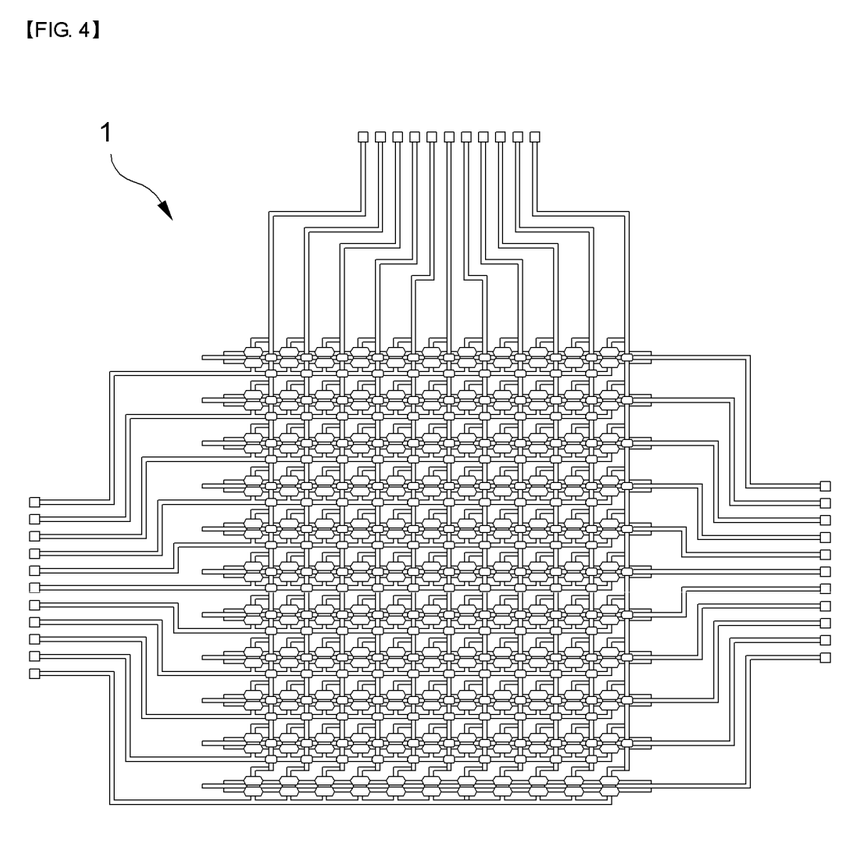
FIG. 4 is a view illustrating the printed thin-film transistor backplane according to an embodiment of the present invention.

In operation S102, a thin-film transistor backplane 1 in FIG. 4 is manufactured by printing using roll-to-roll gravure equipment and an inkjet printer in FIGS. 2 and 3.

Figure 5:
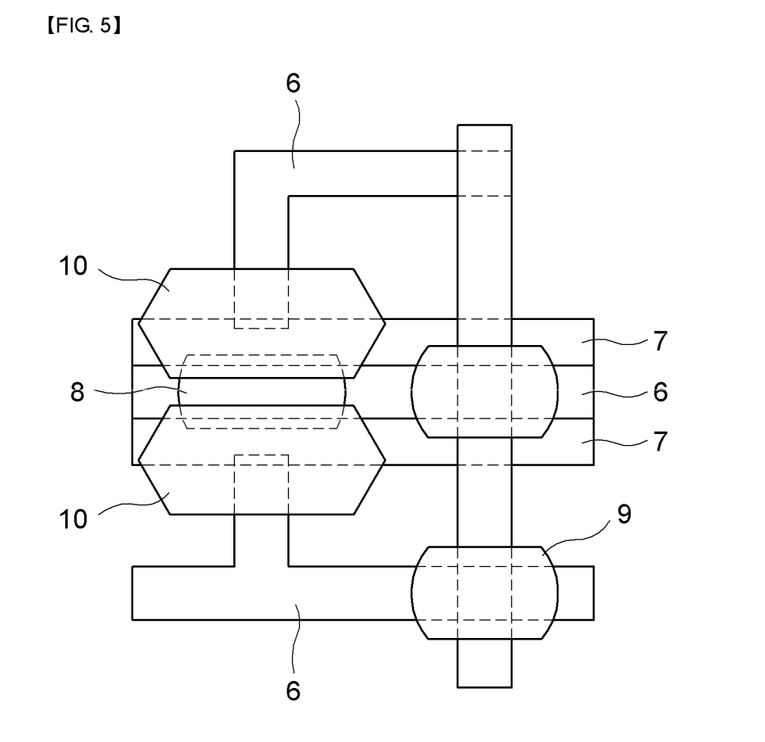
FIG. 5 is a mimetic diagram of a thin-film transistor constituting the backplane in FIG. 4.
Figure 6:
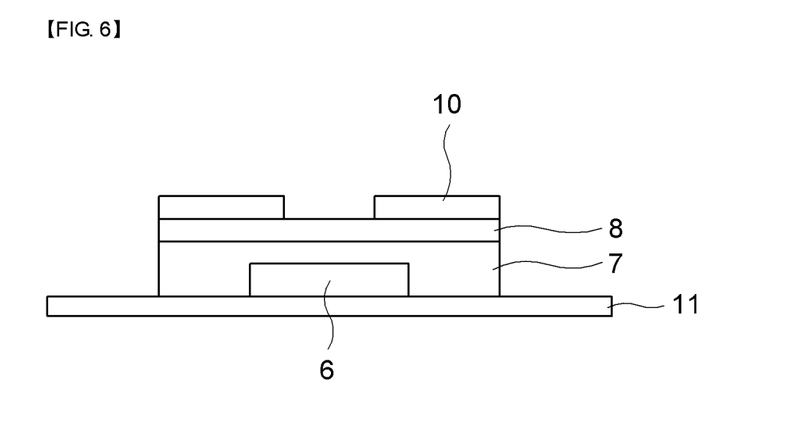
FIG. 6 is a structural view of a bottom gate constituting the backplane in FIG. 4.

Here, as illustrated in FIGS. 5 and 6, a printed thin-film transistor is constituted by total five layers having a bottom gate structure. Here, the five layers include a gate layer 6, a dielectric layer 7, an active layer 9, an insulation layer 9, and a source/drain layer 10 on a PET film 11.

As a base ink, a silver(Ag) ink (PG-007 Paru Co, Korea) for the gate layer 6, a BaTiO3-based dielectric ink (PD-100, Paru Co, Korea) for the dielectric layer 7, a single welled carbon nanotube (CNT) ink for the active layer 8, an epoxy-based insulating ink for the insulation layer 9, an ink (PG-007 Paru Co, Korea) for the source/drain layer 10 are used. Optimization of the ink is performed by using various kinds of dispersants, organic solvents, and binders.

First, the PET film 11 is mounted on the roll-to-roll gravure printing equipment, and then a dancer roll and a jacking system is controlled through a control system to set a tensile strength and a printing pressure of the PET film 11

Here, desirably, the tensile strength is 5 to 7 kg, and the printing pressure is 6 to 8 kg. According to a property of the corresponding ink and characteristics of the roll plate making, a blading condition is understood and the printing is performed.

The gate layer 6 is dried at a temperature of 150° C. while passing through an oven mounted on the roll-to-roll gravure printing equipment after printed in the first printing unit, and then moved to the next second printing unit.

Overlay accuracy is controlled by using an overlay mark printed in the first printing unit using an overlay CCD camera mounted on the second printing unit, and then an overlay printing of the dielectric layer 7 is performed.

While printing for the rest layers is sequentially performed in the same manner as that of the overlay printing of the dielectric layer 7, a printing speed is 6 to 8 m/min, and an oven temperature for drying each layer is 100° C. for dielectric layer 7, 150° C. for the active layer 8, 150° C. for the insulation layer 9, and 150° C. for the source/drain layer 10.

Figure 7:
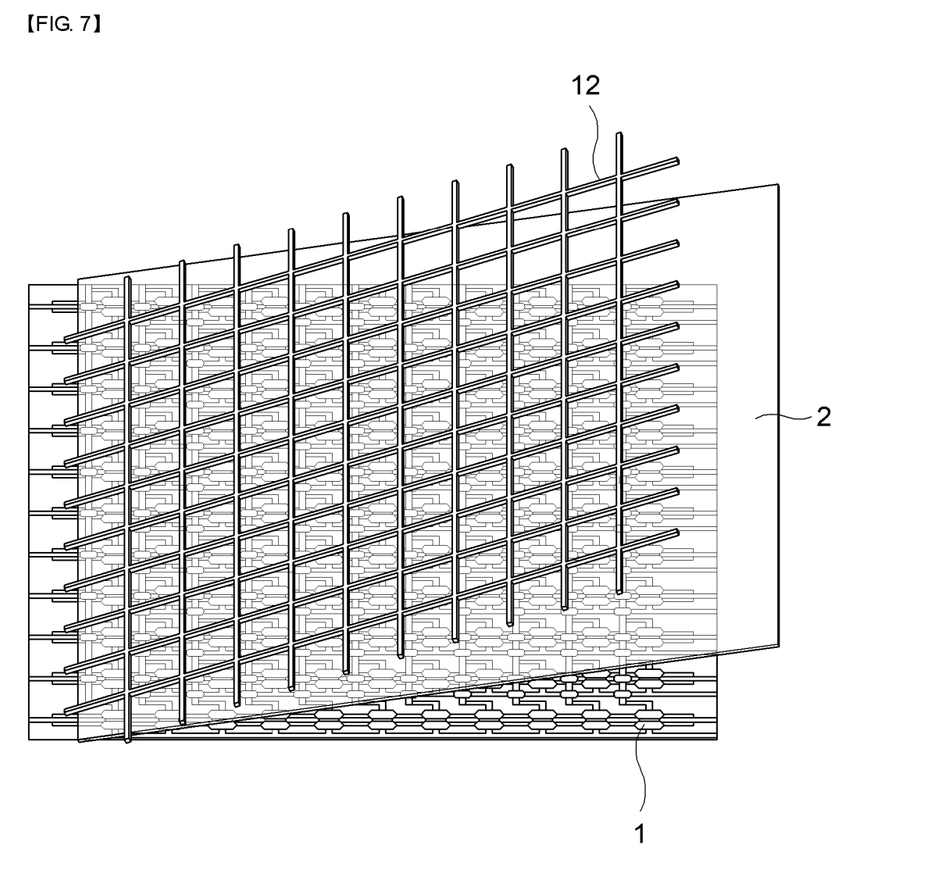
FIG. 7 is a view illustrating a protective layer and a mesh thin-film formed based on the backplane in FIG. 4.

Thereafter, in operation S104, the protective layer 2 is formed on the thin-film transistor backplane 1 by printing (refer to FIG. 7).

When the active layer 8 directly contacts an external substance, a single-wall carbon nanotube (SWCNT)-based printed thin-film transistor receives variation by which an electrical characteristic of the thin-film transistor is not restored to an original state.

To prevent this, the protective layer 2 is necessary on the thin-film transistor.

Also, the protective layer 2 having a surface tension less than that of an ionic liquid drop 4 is necessary to improve a flow characteristic and control wetting of second liquid, i.e., the ionic liquid drop 4 (which will be described later), which may have an effect on an electrical characteristic of the thin-film transistor.

In the present invention, as an embodiment of the above-described protective layer 2, a functional material, i.e., Cytop that is an amorphous fluorocarbon polymer, is printed on the thin-film transistor backplane 1.

Here, when a thickness of the printed protective layer 2 is too thick or thin, the electrical characteristic of the thin-film transistor element may not be changed or permanently changed.

When the ionic liquid drop 4 is disposed on the corresponding thin-film transistor element, the thin-film transistor element is affected by the ionic liquid drop 4, and the electrical characteristic thereof is changed so that the thin-film transistor backplane 1 operates as a sensor. After the ionic liquid drop 4 passes through the corresponding thin-film transistor element, the electrical characteristic of the thin-film transistor needs to be restored to the original state again.

In the present invention, through optimization of the printed protective layer 2, a flow characteristic of the ionic liquid drop 4 is improved, and wetting thereof is prevented, so that a function of a sensor is realized.

Thereafter, in operation S106, a thin-film 12 having a specific morphology and a thickness is printed on the protective layer 2 (refer to FIG. 7).

When the ionic liquid drop 4 is disposed on an inclined surface according to a fluid mechanical feature, and gravitational force acting on the ionic liquid drop is greater than attaching force between the ionic liquid drop and the inclined surface, the ionic liquid drop 4 continuously flows in a gravitational direction regardless of an angle of the inclined surface.

To overcome the above-described problem, the thin-film 12 having a predetermined thickness and a specific morphology (e.g., mesh shape or stair shape) is printed on the protective layer 2 applied on the thin-film transistor backplane 1 to hold the ionic liquid drop 4 on a predetermined position at a predetermined inclined angle.

Through this, flow resistivity of the ionic liquid drop 4 may increase to hold the ionic liquid drop 4 at a predetermined angle on the corresponding thin-film transistor element, and a measurement range and accuracy of the manufactured sensor may be improved.

Figure 8:
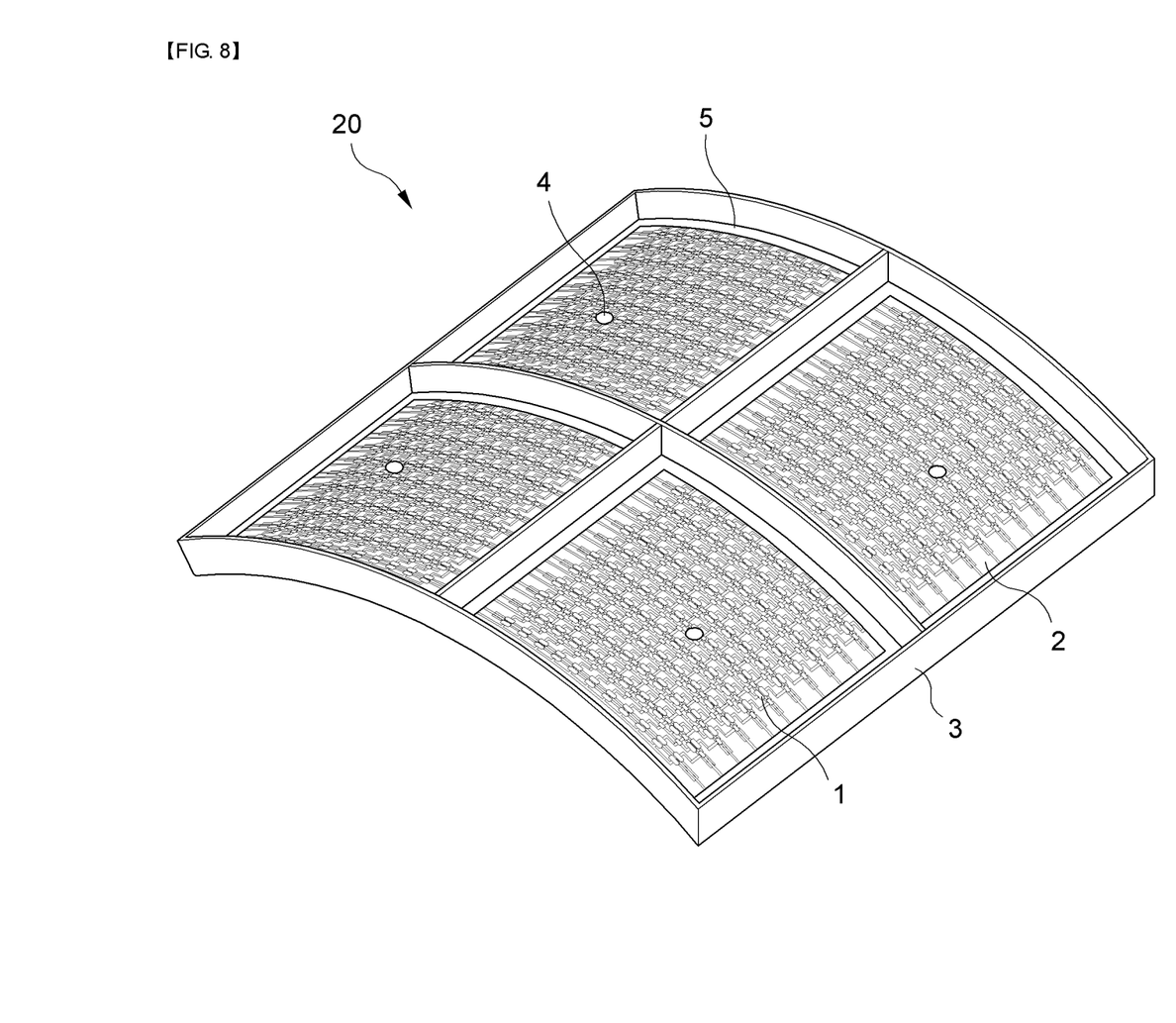
FIG. 8 is a view illustrating a curved state of an angle and curvature detection sensor manufactured in an embodiment of the present invention.
Figure 9:
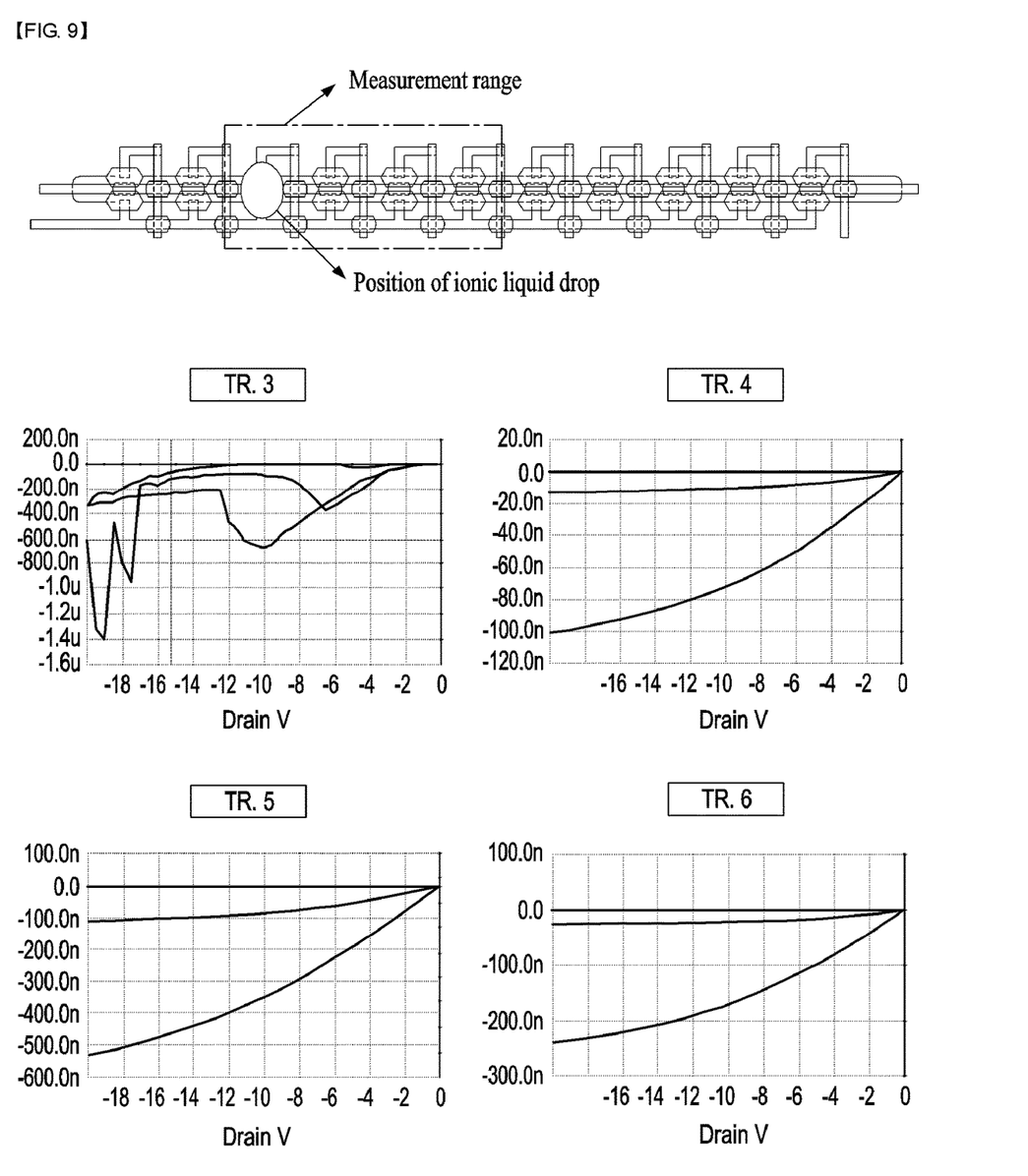
FIGS. 9 to 12 are graphs illustrating an effect on a current characteristic of a thin-film transistor constituting the angle and curvature detection sensor in FIG. 8.
Figure 10:
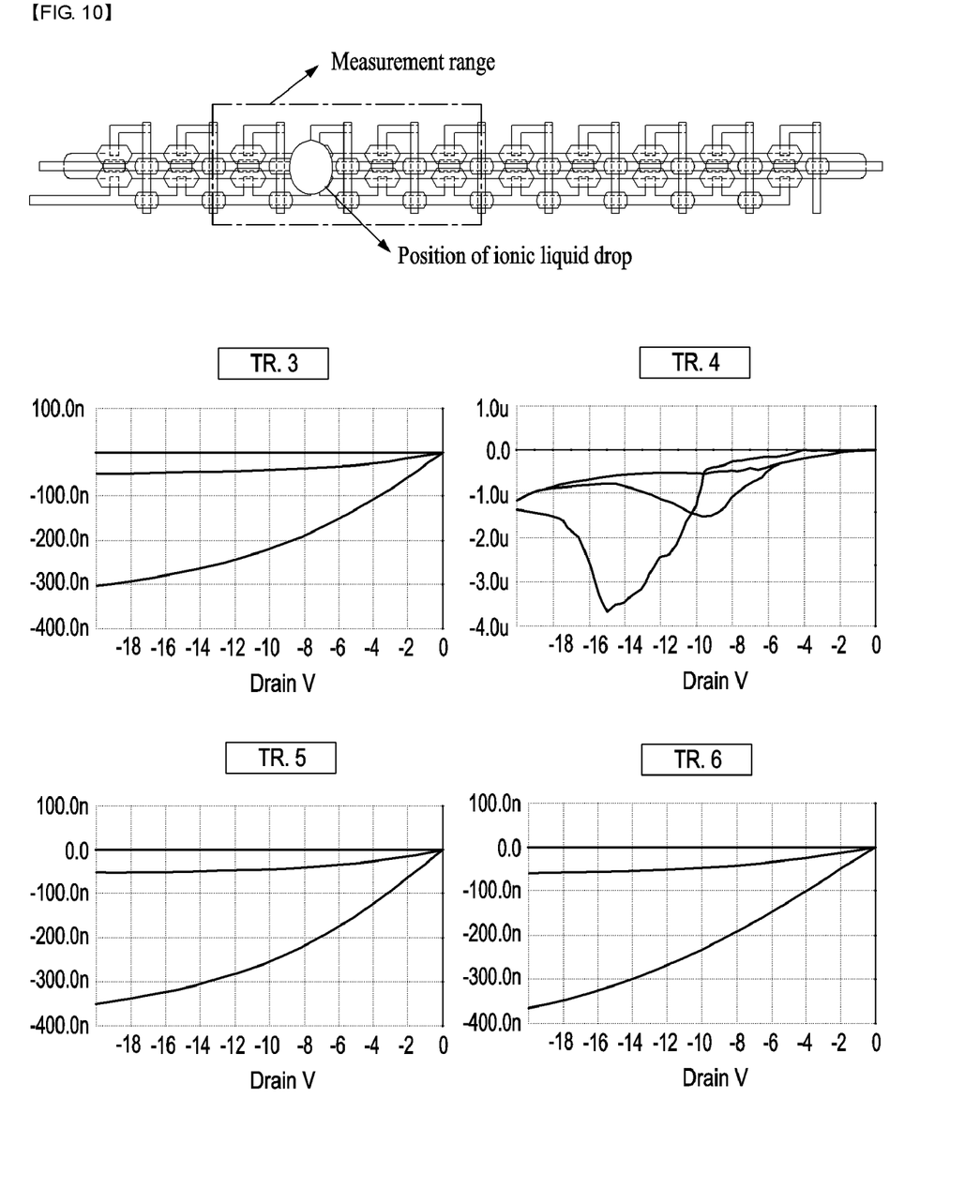
Figure 11:
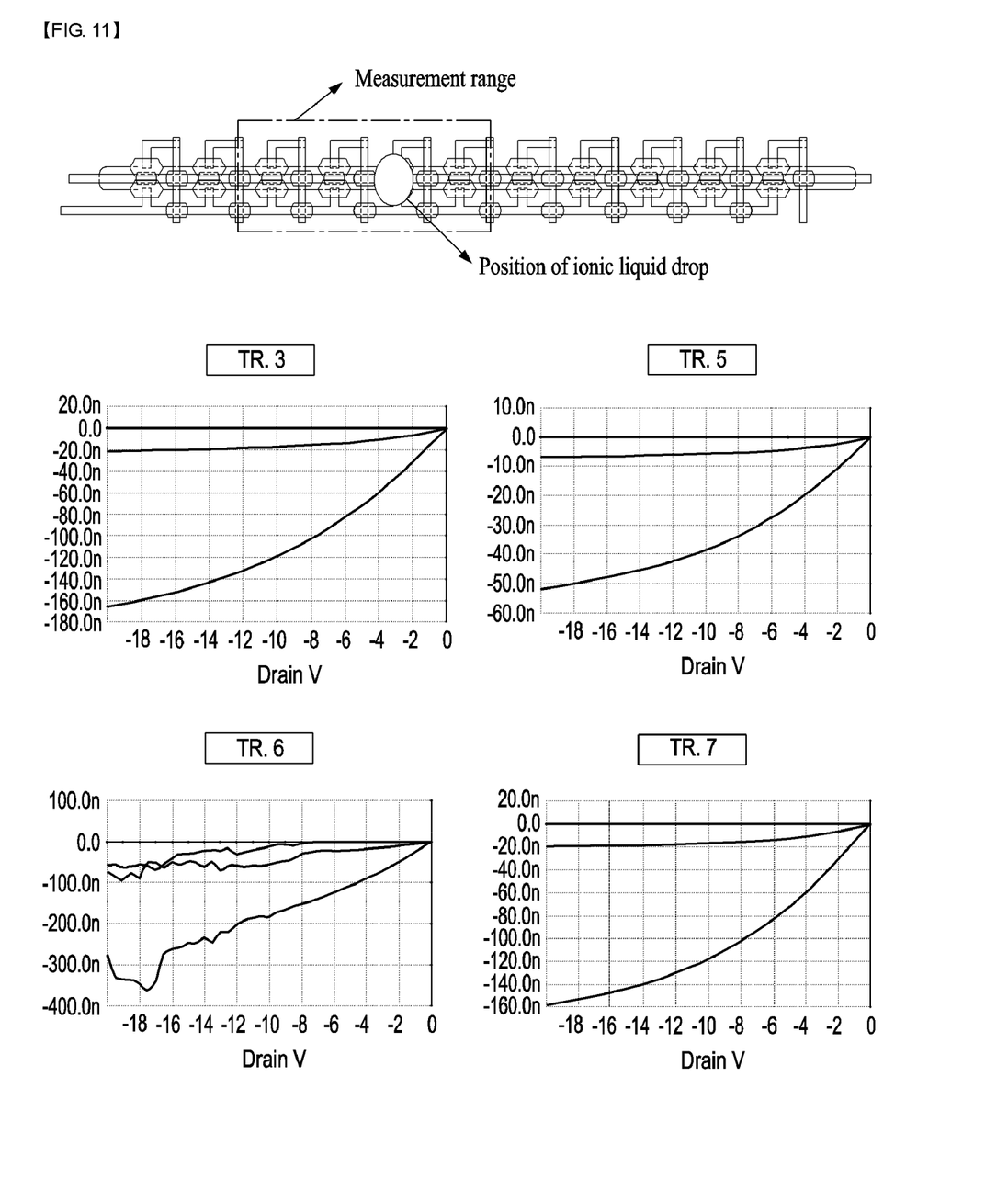
Figure 12:
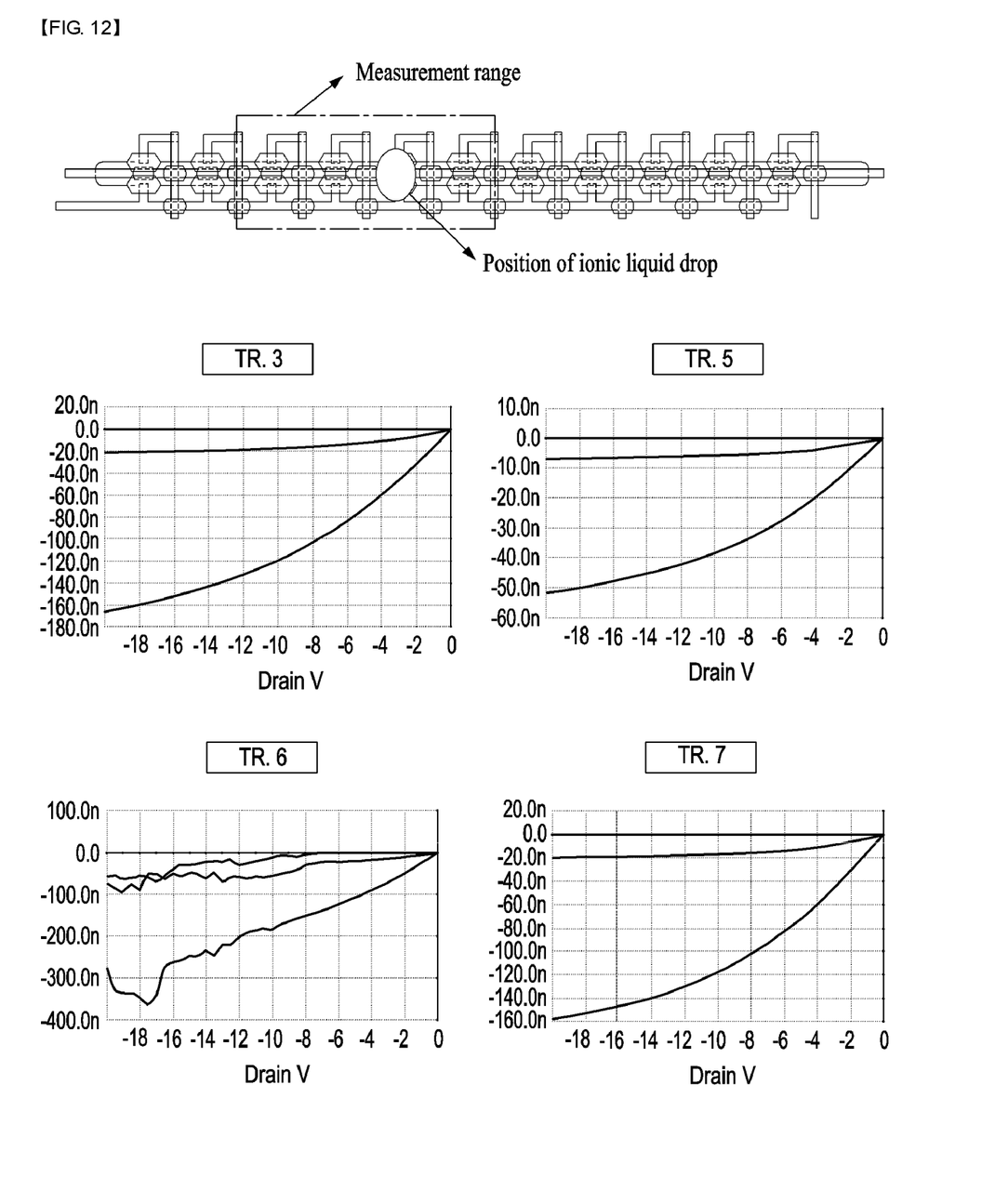

Thereafter, in operation S108, a sealed space is formed by adhering a flexible plastic case 3 to onto the protective layer 2, on which the thin-film is formed, by means of an adhesive (refer to FIG. 8).

Then, in operation S110, the space sealed by the case 3 is filled with first liquid, i.e., silicone oil 5, and a small amount of the second liquid, i.e., the ionic liquid drop 4 is injected therein (refer to FIG. 8).

The silicone oil 5 may have optimized rheology that does not affect the electrical characteristic of the printed thin-film transistor, and the ionic liquid drop 4 may pass through the protective layer 2 printed on a surface of the thin-film transistor backplane 1 to have an effect on the electrical characteristic of the printed thin-film transistor.

Since the ionic liquid drop 4 has a specific gravity relatively greater than that of the silicone oil 5 and is not mixed with the silicone oil 5, the ionic liquid drop 4 is sunken and remained on the surface of the functional protective layer 2.

Also, since the ionic liquid drop 4 has surface tension greater than that of the functional protective layer2, the ionic liquid drop 4 may have a flow characteristic allowing the ionic liquid drop to move while maintaining a shape of liquid drop on the functional protective layer 2.

Meanwhile, viscosity of the silicone oil 5 greatly affects on the flow characteristic of the ionic liquid drop 4.

That is, when the viscosity of the silicone oil 5 is too high, a flow speed of the ionic liquid drop 4 decreases to delay a responding speed of the sensor, and when the viscosity of the silicone oil 5 is too low, the flow speed of the ionic liquid drop 4 increases, but detection accuracy is reduced because the flow resistivity of the ionic liquid drop 4 is too low.

In the present invention, absolute viscosity of the silicone oil, which is optimized through an experiment using the silicone oils 5 having various viscosities, is 50 centipoises (cP).

The angle and curvature detection sensor 20 in FIG. 8 is manufactured through the above-described process. The angle and curvature detection sensor 20 includes the printed thin-film transistor backplane 1 in an N×M array, the protective layer 2 for maintaining an electrical property of the thin-film transistor backplane 1, the ionic liquid drop 4 having an effect on the electrical characteristic of the thin-film transistor while moving in a small drop shape on the surface of the thin-film transistor backplane 1, the silicone oil 5 providing buoyancy to allow the ionic liquid drop 4 to move on the thin-film transistor backplane 1, and the flexible sealing case 3 for holding the ionic liquid drop 4 and the silicone oil 5 on the surface of the thin-film transistor backplane 1.

Also, the pattern (thin-film) 12 having the specific morphology is formed on the surface, on which the protective layer 2 is applied, of the thin-film transistor backplane 1 by printing so that the ionic liquid drop 4 has linear movement according to the angle position and the degree of curvature of the sensor 20 in the angle and curvature detection sensor.

Also, the angle and curvature detection sensor 20 includes four areas, and the ionic liquid drops 4 existing on the four areas in the angle and curvature detection sensor 20 flow down along the surface of the functional protective layer 2 due to an effect of the gravity when the angle and curvature detection sensor 20 is inclined along the X-axis and the Y-axis. Here, the change in the electrical characteristic of the thin-film transistor backplane 1 may be detected to detect the angle position and the degree of curvature.

Here, a flow speed and a stop position of the ionic liquid drop 4 is controlled by the printed morphology pattern (thin film) 12.

FIGS. 9 to 12 are graphs illustrating an effect on the electrical characteristic of the thin-film transistor constituting the angle and curvature detection sensor in FIG. 8.

A method for measuring 3-dimensional angle change and a degree of curvature of the manufactured angle and curvature detection sensor 20 is realized through an active-type thin-film transistor measuring system and an angle calculation algorithm by using the LabVIEW produced by National Instruments (NI).

Here, as a measurement condition, an applied bias is fixed to a drain voltage of −20V and a gate voltage of −20V, and then current (Ids) flowing between the drain and the source is measured to detect an angle and a degree of curvature.

When the angle and curvature detection sensor 20 is in a horizontal state, the ionic liquid drop 4 is disposed on a central origin of the sensor. The ionic liquid drop 4 moves to the thin-film transistor element in a direction corresponding to a movement direction of the angle and curvature detection sensor 20, which is affected by gravitational force of the ionic liquid drop as rotational movement and curvature of the X-axis and the Y-axis occur.

Here, as Ids of each of the thin-film transistor constituting the thin-film transistor backplane 1 is measured, a position of the ionic liquid drop 4 is recognized.

In FIGS. 9 to 12, it is noted that the Ids of the thin-film transistor disposed at a position at which the ionic liquid drop is disposed is remarkably varied more than the Ids of a different thin-film transistor disposed at a position at which the ionic liquid drop is not disposed. Through this, the position of the ionic liquid drop may be recognized.

Finally, through comparison between the position of the ionic liquid drop after movement and the position of the origin, the rotational angle and curvature of the angle and curvature detection sensor 20 may be measured.

Although the exemplary embodiments of the present invention have been described, it is understood that the present invention should not be limited to these exemplary embodiments. Also, various changes and modifications can be made by one ordinary skilled in the art within the spirit and scope of the present invention as hereinafter claimed.

| [DESCRIPTION OF SYMBOLS] | |
| --- | --- |
| 1: Thin-film transistor backplane | 2: Protective layer |
| 3: Case | 4: Ionic liquid drop |
| 5: Silicone oil | 6: Gate layer |
| 7: Dielectric layer | 8: Active layer |
| 9: Insulation layer | 10: Source and drain layer |
| 11: PET film | 12: Thin-film (Pattern) |
| 20: Angle and curvature detection sensor | |

The invention claimed is:

1. A method for manufacturing an angle and curvature detection sensor comprising the following steps of:
   (a) manufacturing a thin-film transistor backplane by a roll-to-roll gravure printing process;
   (b) forming a protective layer on the thin-film transistor backplane by printing;
   (c) forming a sealed space by adhering a flexible case onto the protective layer by means of an adhesive; and
   (d) filling the sealed space with a first liquid and injecting a second liquid therein.

2. The method of claim 1, wherein the second liquid is an ionic liquid drop having a small drop shape and moving on a surface of the protective layer to have an effect on an electrical characteristic of a thin-film transistor when staying on the protective layer right above the thin-film transistor and allow the electrical characteristic of the thin-film transistor to be restore when deviated therefrom, and the first liquid is silicone oil providing buoyancy to the ionic liquid drop and having no effect on the electrical characteristic of the thin-film transistor.

3. The method of claim 1, wherein in the step (a), a conductive ink, a dielectric ink, an active layer ink, and an insulating ink are printed by using a roll-to-roll gravure equipment to manufacture an N×M array thin-film transistor backplane.

4. The method of claim 3, wherein in the step (a), a printing speed is 6 to 8 m/min.

5. The method of claim 1, wherein in the step (d), flow resistivity of the second liquid is controlled by adjusting viscosity of the first liquid.

6. The method of claim 1, further comprising a step of forming a thin-film having a specific morphology and a thickness on the protective layer by printing between the step (b) and the step (c).

7. The method of claim 1, wherein in the step (b), Cytop is printed to form the protective layer.

8. An angle and curvature detection sensor comprising:
   a thin-film transistor backplane printed by using a roll-to-roll equipment and formed in an N×M array;
   a protective layer for maintaining an electrical characteristic of the thin-film transistor backplane;
   a second liquid having a small drop shape and moving on the protective layer to have an effect on an electrical characteristic of a thin-film transistor therebelow;
   a first liquid providing buoyancy to allow the second liquid to move on the protective layer; and
   a flexible sealed case for holding the second liquid and the first liquid on a surface of the thin-film transistor backplane.

9. The angle and curvature detection sensor of claim 8, wherein the second liquid is an ionic liquid drop, and the first liquid is silicone oil.

10. The angle and curvature detection sensor of claim 9, wherein a thin-film having a specific morphology and a thickness is formed on the protective layer by printing so that the ionic liquid drop has linear movement according to an angle position and a degree of curvature of the sensor.

11. The angle and curvature detection sensor of claim 10, wherein the specific morphology is a shape of a mesh or a stair.

12. The angle and curvature detection sensor of claim 9, wherein the sensor comprises four areas, and the ionic liquid drop is provided on each of the four areas.

13. The angle and curvature detection sensor of claim 8, wherein the thin-film transistor has a bottom gate structure comprising a gate layer, a dielectric layer, an active layer, an insulation layer, and a source/drain layer.

14. The angle and curvature detection sensor of claim 13, wherein a voltage applied to the drain and the gate is fixed, and then a current flowing between the drain and the source is measured to detect an angle and a degree of curvature of the sensor.

* * * * *